United States Patent
Ding et al.

(10) Patent No.: US 9,401,189 B1
(45) Date of Patent: Jul. 26, 2016

(54) METHODS AND APPARATUS FOR PERFORMING RUNTIME DATA EYE MONITORING AND CONTINUOUS DATA STROBE CALIBRATION

(71) Applicant: Altera Corporation, San Jose, CA (US)

(72) Inventors: Weiqi Ding, Fremont, CA (US); Warren Nordyke, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 349 days.

(21) Appl. No.: 13/842,297

(22) Filed: Mar. 15, 2013

(51) Int. Cl.
*G11C 7/10* (2006.01)
*G11C 7/22* (2006.01)

(52) U.S. Cl.
CPC ............... *G11C 7/222* (2013.01); *G11C 7/106* (2013.01)

(58) Field of Classification Search
CPC ........ G11C 7/222; G11C 7/22; G11C 7/1072; G11C 7/12; G11C 5/02; G11C 8/10; G11C 5/025; G11C 7/18; G11C 11/4076; G11C 11/4085; G11C 11/4093; G11C 7/1051; G11C 8/08; G11C 8/18; G11C 11/4096
USPC ............. 365/189.05, 194, 191, 222, 154, 365/230.01, 230.06, 185.18
See application file for complete search history.

(56) References Cited

U.S. PATENT DOCUMENTS

| | | |
|---|---|---|
| 7,475,315 B1 | 1/2009 | Natarajan et al. |
| 7,664,978 B2 | 2/2010 | Burney et al. |
| 8,004,915 B1 | 8/2011 | Dastidar et al. |
| 8,565,033 B1 | 10/2013 | Manohararajah et al. |
| 8,565,034 B1 | 10/2013 | Lu et al. |
| 8,588,014 B1 | 11/2013 | Fung et al. |
| 2007/0217559 A1* | 9/2007 | Stott et al. ................... 375/355 |
| 2007/0239379 A1 | 10/2007 | Newcomb et al. |
| 2009/0031091 A1 | 1/2009 | Chang et al. |
| 2010/0180143 A1 | 7/2010 | Ware et al. |
| 2010/0315119 A1 | 12/2010 | Welker et al. |

OTHER PUBLICATIONS

Azizi et al., U.S. Appl. No. 13/715,484, filed Dec. 14, 2012.
Chong et al., U.S. Appl. No. 13/686,727, filed Nov. 27, 2012.
Shiao et al., U.S. Appl. No. 13/562,204, filed on Jul. 30, 2013.
Blunno et al., U.S. Appl. No. 13/539,153, filed on Jun. 29, 2012.

* cited by examiner

*Primary Examiner* — Thong Q Le
(74) *Attorney, Agent, or Firm* — Treyz Law Group, P.C.; Jason Tsai

(57) ABSTRACT

Integrated circuits may include memory interface circuitry operable to communicate with system memory. The memory interface circuitry may receive data (DQ) and data strobe (DQS) signals from system memory during read operations. The memory interface circuitry may include startup calibration circuitry and runtime calibration circuitry. The startup calibration circuitry may be used upon device startup to perform a one-time data de-skew and DQ/DQS centering. The runtime calibration circuitry may include at least two data sampling circuits, a first of which is used in active mode to latch incoming data and a second of which is used in redundant mode to obtain data eye boundary information on a continuous basis. The received DQS signal may be adjusted based on the obtained eye boundary information so that DQS properly positioned within the data eye periodically or on an as-needed basis.

18 Claims, 11 Drawing Sheets

METHODS AND APPARATUS FOR PERFORMING RUNTIME DATA EYE MONITORING AND CONTINUOUS DATA STROBE CALIBRATION

BACKGROUND

Programmable integrated circuits are a type of integrated circuit that can be configured by a user to implement custom logic functions. In a typical scenario, a logic designer uses computer-aided design (CAD) tools to design a custom logic circuit. When the design process is complete, the CAD tools generate configuration data. The configuration data is loaded into a programmable integrated circuit to configure the device to perform desired logic functions.

In a typical system, a programmable integrated circuit, memory devices, and other electronic components are mounted on a printed circuit board. The programmable integrated circuit includes memory interface circuitry that is used to relay data back and forth between the programmable integrated circuit and the memory devices (i.e., the memory interface circuitry is used to read data from and write data into the memory devices). When performing such memory read and write operations, the timing of control and data signals is critical.

Because programmable integrated circuits can be configured in many different ways and are installed on many different types of boards, the lengths of circuit board traces coupling the programmable integrated circuit to the memory devices can vary from one system to another. As a result, it is generally not possible to know in advance exactly how data and clock paths between a programmable integrated circuit and a given memory device will perform. In some systems, the data and clock paths may have one set of timing characteristics, whereas in other systems the data and clock paths may have a different set of timing characteristics.

Mismatch (or skew) between the data and clock paths may result in degraded setup and hold times. In modern high speed memory interface circuitry that uses double data rate (DDR) transfers (i.e., a data transmission scheme in which data toggles on both rising and falling edges of the clock), a small amount of skew will result in faulty data transfer during read/write operations. The clock that is used for transferring memory data is often referred to as the data strobe.

Conventional memory systems sometimes include circuitry for performing data strobe calibration during device startup (i.e., calibration operations for minimizing skew between the data and data strobe signals). During normal user operation, however, variations in the operating condition (i.e., voltage and temperature variations) can introduce random skew between the data and data strobe signals even after the startup calibration.

SUMMARY

Integrated circuits such as programmable integrated circuits having memory interface circuitry are provided. The memory interface circuitry may be used to communicate with off-chip (external) memory devices that are mounted on a circuit board. The memory devices and the circuit board to which the memory devices are mounted may collectively be referred to as a memory module. Data and data strobe signals may be transmitted between the memory devices and the memory interface circuitry. The memory interface circuitry may provide system-level control signals (e.g., a reference clock signal, address signal, and command signal) to the memory devices.

During read operations, the memory interface circuitry may send appropriate system control signals to the memory module to read data out of the memory devices. The memory devices may output read data and associated data strobe signals. The read data may be latched using data sampling circuits (sometimes referred to as latches or registers). The read data (DQ) signals may be fed to the data sampling circuits via a first path, whereas an associated data strobe (DQS) signal may be fed to the data sampling via a second path.

In an embodiment of the present invention, the memory interface circuitry may include first and second data sampling circuits, a comparator circuit, and associated control circuitry. The first data sampling circuit may receive and latch the data signals using a first version of the data strobe signal, whereas the second data sampling circuit may receive and latch the data signals using a second version of the data strobe signal. In particular, while the first sampling circuit is receiving the first version of the data strobe signals, the second sampling circuit may be controlled using different respective versions of the data strobe signals, each of which has a different phase offset (e.g., the second sampling circuit may receive clock signals with varying phase offsets while the first sampling circuit receives a selected clock signal).

The comparator circuit (e.g., a logic exclusive-OR gate) may be used to compare the data latched by the first data sampling circuit with the data latched by the second data sampling circuit and to output a correspond error signal. The control circuitry may receive the error signal from the comparator circuit and may be used to determine whether the selected clock signal currently controlling the first data sampling circuit satisfies performance criteria. For example, the control circuitry may use the second data sampling circuit to obtain data eye boundary information associated with the data signals by monitoring when the error signal is asserted and deasserted.

In one suitable arrangement, a selected (or updated) delayed version of the data strobe signals may be provided to the second sampling circuit based on the obtain eye boundary information. While the second sampling circuit is receiving the selected delayed version of the data strobe signals, the first sampling circuit may receive the different respective versions of the data strobe signals to obtain additional data eye boundary information. Operated in this way, the first and second data sampling circuits may alternate between an "active" mode during which the active data sampling circuit latches incoming data using the selected delayed version of the data strobe signal and a "redundant" mode during which the redundant data sampling circuit is used to monitor data eye characteristics.

In another suitable arrangement, the selected clock signal that is currently controlling the first data sampling circuit may be adjusted based on the obtain eye boundary information so that the adjusted clock signal has clock edges that are centered within the measured data eye (e.g., to maximize setup and hold time margins). Operated in this way, the first data sampling circuit may serve as an active latch for latching incoming data signals while the second data sampling circuit may serve as a redundant latch for monitoring whether setup and hold times are satisfactory.

Further features of the present invention, its nature and various advantages will be more apparent from the accompanying drawings and the following detailed description.

DETAILED DESCRIPTION

Embodiments of the present invention relate to integrated circuits containing memory interface circuitry. It will be recognized by one skilled in the art, that the present exemplary embodiments may be practiced without some or all of these specific details. In other instances, well-known operations have not been described in detail in order not to unnecessarily obscure the present embodiments.

The memory interface circuitry may be used to interface with off-chip memory such as random-access memory (RAM). The integrated circuits may be digital signal processors, microprocessors, application specific integrated circuits, or other suitable integrated circuits. These types of integrated circuits that are operable to communicate with system memory can benefit from adjustable timing capabilities of the memory interface circuitry.

Figure 1:
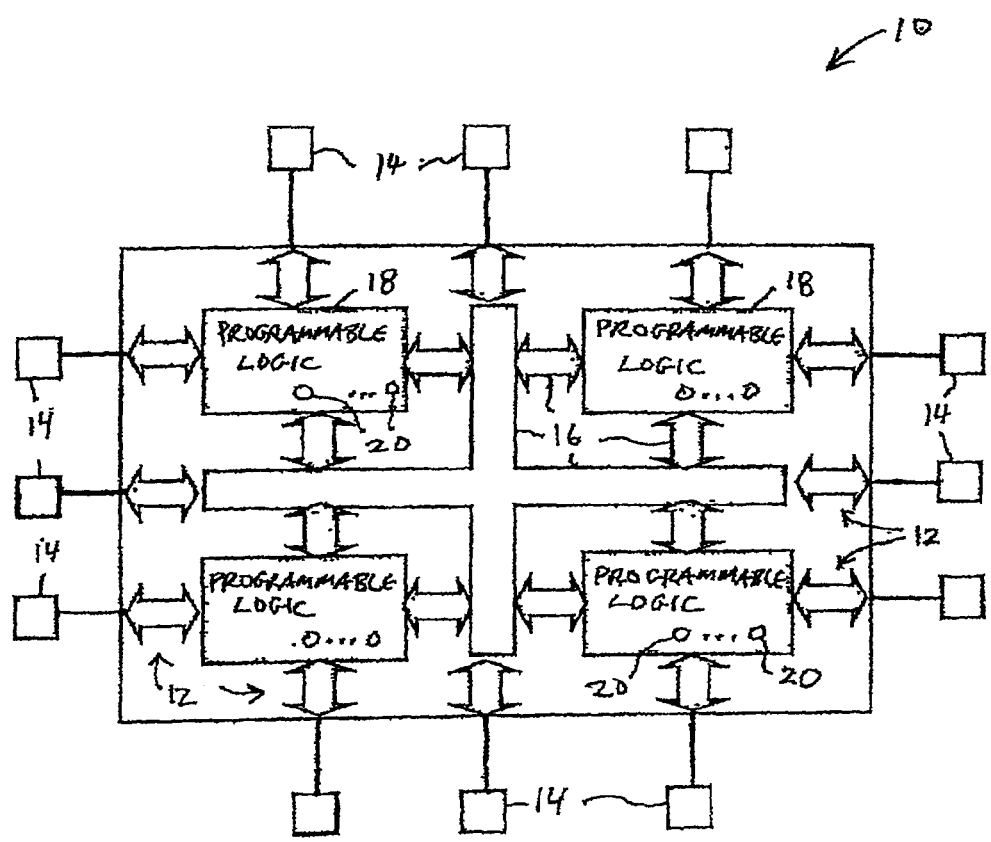
FIG. 1 is a diagram of an illustrative programmable integrated circuit in accordance with an embodiment of the present invention.

As an example, an integrated circuit such as a programmable integrated circuit may include memory interface circuitry. This is merely illustrative and does not serve to limit the scope of the present invention. If desired, application specific integrated circuits, microprocessors, and other application specific standard products may contain memory interface circuitry. FIG. 1 shows a diagram of an illustrative programmable integrated circuit device. As shown in FIG. 1, device 10 may include input-output (I/O) circuitry 12 for driving signals off of device 10 and for receiving signals from other devices via input-output pins 14.

Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. For example, programmable logic 18 may include look-up tables, registers, and multiplexers. The programmable logic 18 may be configured to perform a custom logic function. The programmable interconnects associated with interconnection resources may be considered to be a part of programmable logic 18.

Programmable logic 18 contains programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable element 20 may be used to provide a static control output signal for controlling the state of an associated logic component in programmable logic 18. The output signals generated by elements 20 are typically applied to gates of metal-oxide-semiconductor (MOS) transistors (sometimes referred to as pass gate transistors).

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns. latching circuit deviates from the center location of the measured data valid window by a large enough margin, the switching criteria may be satisfied.

Figure 2:
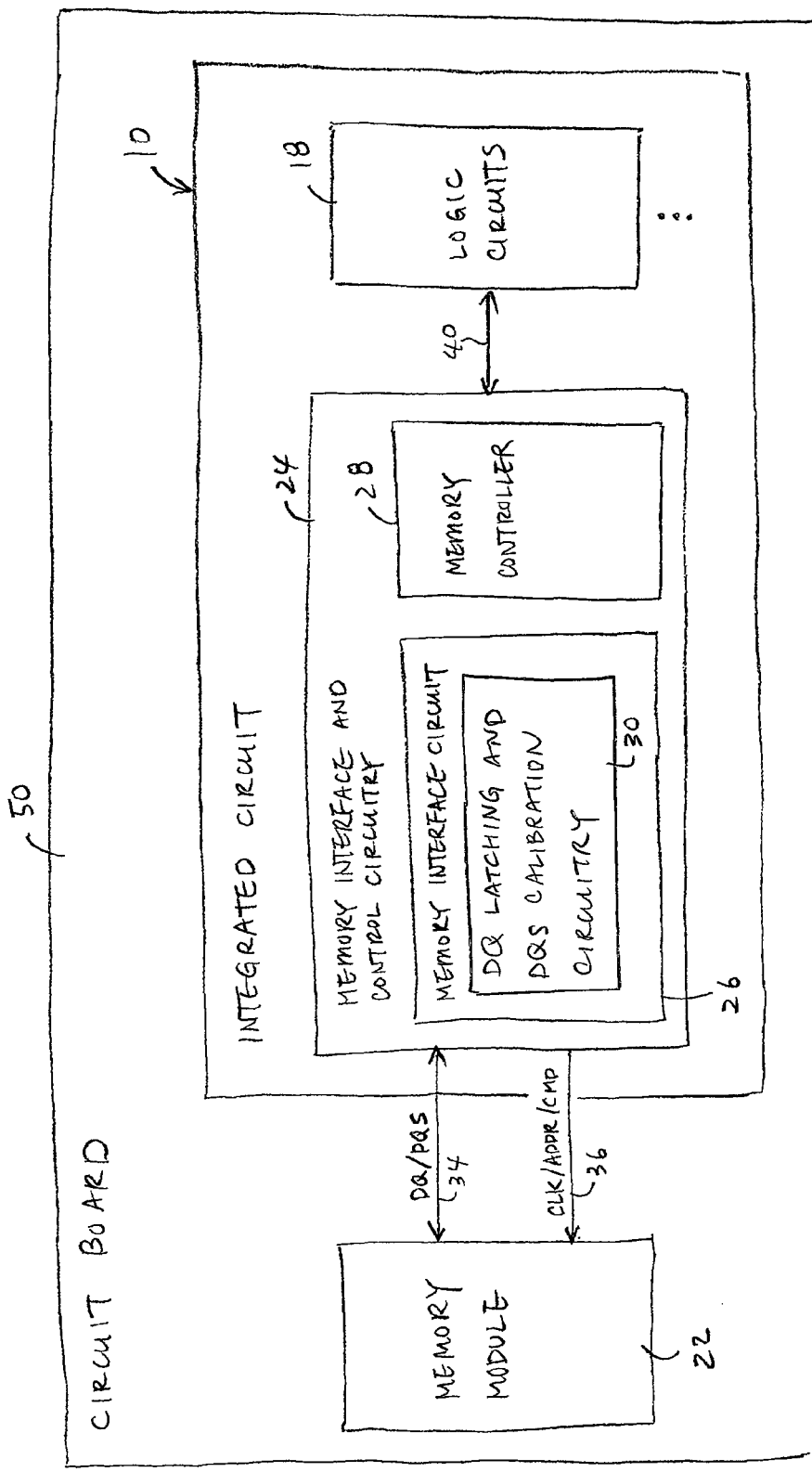
FIG. 2 is a diagram of an illustrative integrated circuit operable to communicate with a memory module in accordance with an embodiment of the present invention.

Device 10 may communicate with off-chip memory such as memory module 22 (see, e.g., FIG. 2). Memory module 22 may be a memory device sometimes referred to as a single in-line memory module (SIMM) or a dual in-line memory module (DIMM). Device 10 may be configured to communicate with at least two memory modules 22, at least four memory modules 22, etc. As shown in FIG. 2, integrated circuit 10, memory module 22, and other circuit components (e.g., integrated circuit chips, surface mount components, etc.) may be mounted on a circuit board 50. Circuit board 50 may, for example, be a rigid printed circuit board (PCB), a flexible circuit board (sometimes referred to as a flex circuit), a rigid flex circuit, or other suitable types of substrates. Board components may be interconnected through conductive traces and packaging (e.g., sockets into which integrated circuits are mounted) formed on board 50.

Device 10 may include memory interface circuitry 24 (sometimes referred to as memory interface and control. circuitry) that serves to relay information between memory module 22 and logic circuits 18 that are internal to device 10.

Memory interface circuitry 24 may include memory interface circuit 26 and memory controller 28. Read/write data may be conveyed between memory interface circuitry 24 and programmable circuitry 18 via path 40. Memory controller 28 may be configured to generate appropriate control signals corresponding to the memory protocol currently under use (e.g., circuit 28 may handle memory data management to address desired banks, rows, and columns and to perform memory refresh).

Memory interface circuit 26 may include data latching and data strobe calibration circuitry 30 and other circuitry operable to perform desired data rate conversions and to generate signals that meet timing requirements specified by the memory protocol currently under use. Memory interface circuit 26 may be coupled to memory module 22 through paths 34 and 36. During memory read operations, data (DQ) signals and data strobe (DQS) signals may be conveyed from memory module 22 to memory interface circuit 26 over path 34. During memory write operations, DQ/DQS may be conveyed from memory interface circuit 26 to memory module 22 over path 34. In particular, circuitry 30 may include clocked storage elements that are used to latch incoming DQ signals using associated DQS signals when retrieving data from memory module 22. Circuitry 30 may also be used to perform calibration operations to ensure that incoming DQ and DQS signals meet timing criteria.

During memory access operations (e.g., memory read and memory write operations), control signals such as clock CLK, address ADDR, and command CMD signals may be conveyed from memory controller 28 to memory module 22 over path 36. Signal CLK may serve as a system reference clock (e.g., a reference clock to the DQS signals, address signal ADDR, and command signal CMD should be aligned). Signal CMD may be configured to a first value to initiate a read operation, to a second value to initiate a write operation, to a third value during normal operation, and to other values to initiate any desired operations. Signal ADDR specifies the address (e.g., a selected bank address in a memory device) from which data is read out during read operations and the address to which data is written during write operations.

The arrangement of FIG. 2 is merely illustrative and is not intended to limit the scope of the present invention. Integrated circuits other than programmable integrated circuits may similarly include memory interface circuitry 24 that is used to communicate with one or more memory modules 22.

Figure 3:
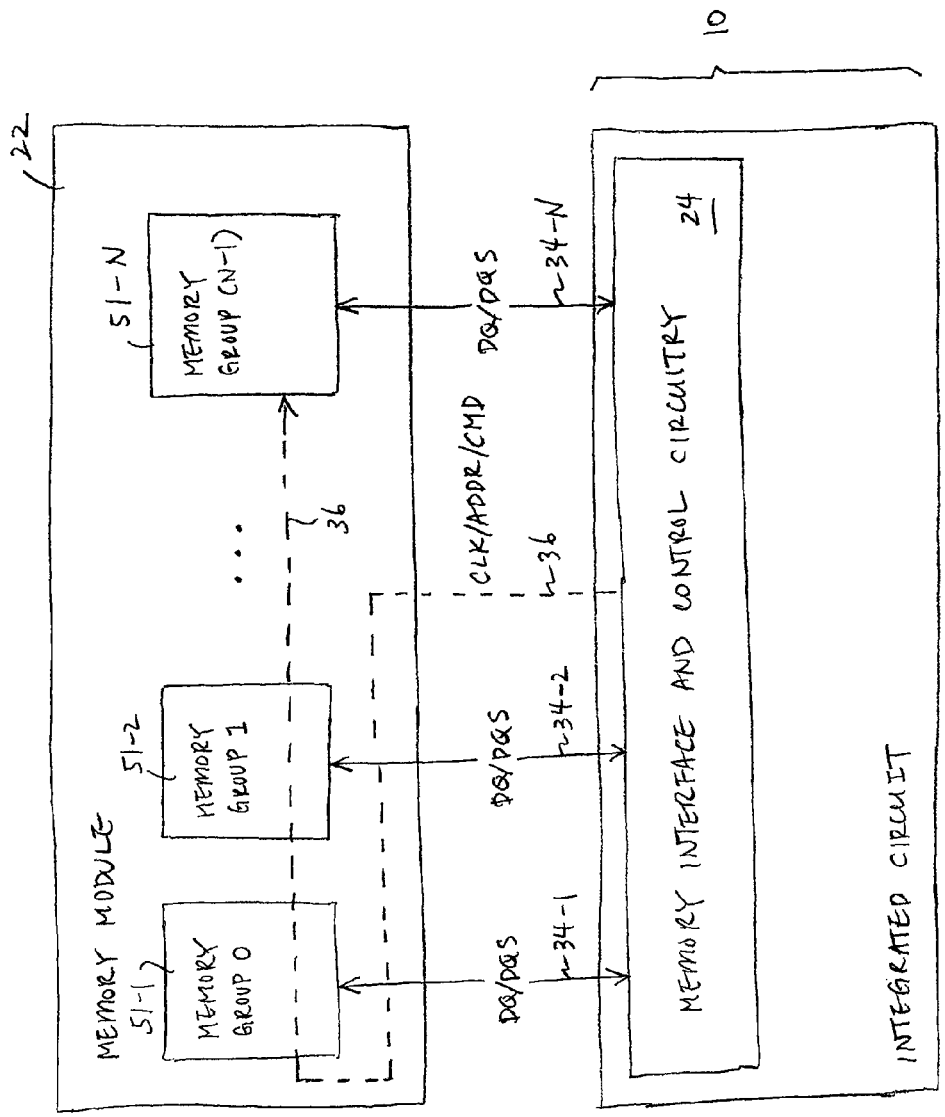
FIG. 3 is a diagram of an illustrative memory module that contains multiple memory groups in accordance with an embodiment of the present invention.

FIG. 3 is a diagram of memory module 22 that includes a series of memory devices, each of which is sometimes referred to as a memory group. For example, memory module 22 may include first memory group 51-1, second memory group 51-2, . . . , and $N^{th}$ memory group 51-N. Memory module 22 may include nine memory groups (as an example). Each of the memory groups may contain hundreds or thousands of memory cells (e.g., RAM cells). The memory groups may communicate with memory interface circuitry 24 through respective signal paths. For example, first memory group 51-1 may communicate with circuitry 24 by sending data and data strobe signals (i.e., DQ and DQS) over path 34-1, second memory group 51-2 may communicate circuitry 24 by sending DQ/DQS over path 34-2, etc., In general, memory access operations are not synchronized with system-level control signals CLK/CMD/ADDR. As a result, the DQ signals that are received from memory module 22 are not phase aligned with any known clock signal in device 10. It is therefore necessary to provide DQS clock signals with the DQ signals, so that the DQS clocks can be used to establish proper timing relationships when processing the DQ signals. For example, during a read operation, memory interface circuitry 24 uses the DQS clocks in capturing data as it is transmitted over paths 34 from memory 22. Process, voltage, and temperature (PVT) variations may introduce skew between the DQ and DQS signals, resulting in degraded data sampling margins (i.e., reduced setup and hold times).

The operation of each memory group is somewhat independent, so memory module 22 generates a separate DQS signal for each of the memory groups. Memory interface circuitry 24 may send control signals to the memory groups via path 36. Memory module 22 of FIG. 3 may be a type of memory module in which the control signals on path 36 arrive at each of the memory groups at different times. For example, because of the way path 36 is routed, the control signals on path 36 may arrive first at memory group 51-1 and then arrive at each subsequent memory group after some delay.

During read operations, appropriate control signals may be sent over path 36 to direct the memory groups to output read data. Read data may be generated from the memory groups at different times depending on when control signals CLK/CMD/ADDR arrive at a particular memory group. For example, memory group 51-1 may output read data before subsequent memory group 51-2, memory group 51-2 may output read data before subsequent memory group 51-3, memory group 51-3 may output read data before subsequent memory group 51-4, etc. Memory interface circuitry 24 may therefore receive read data from the different memory groups at staggered times.

Figure 4:
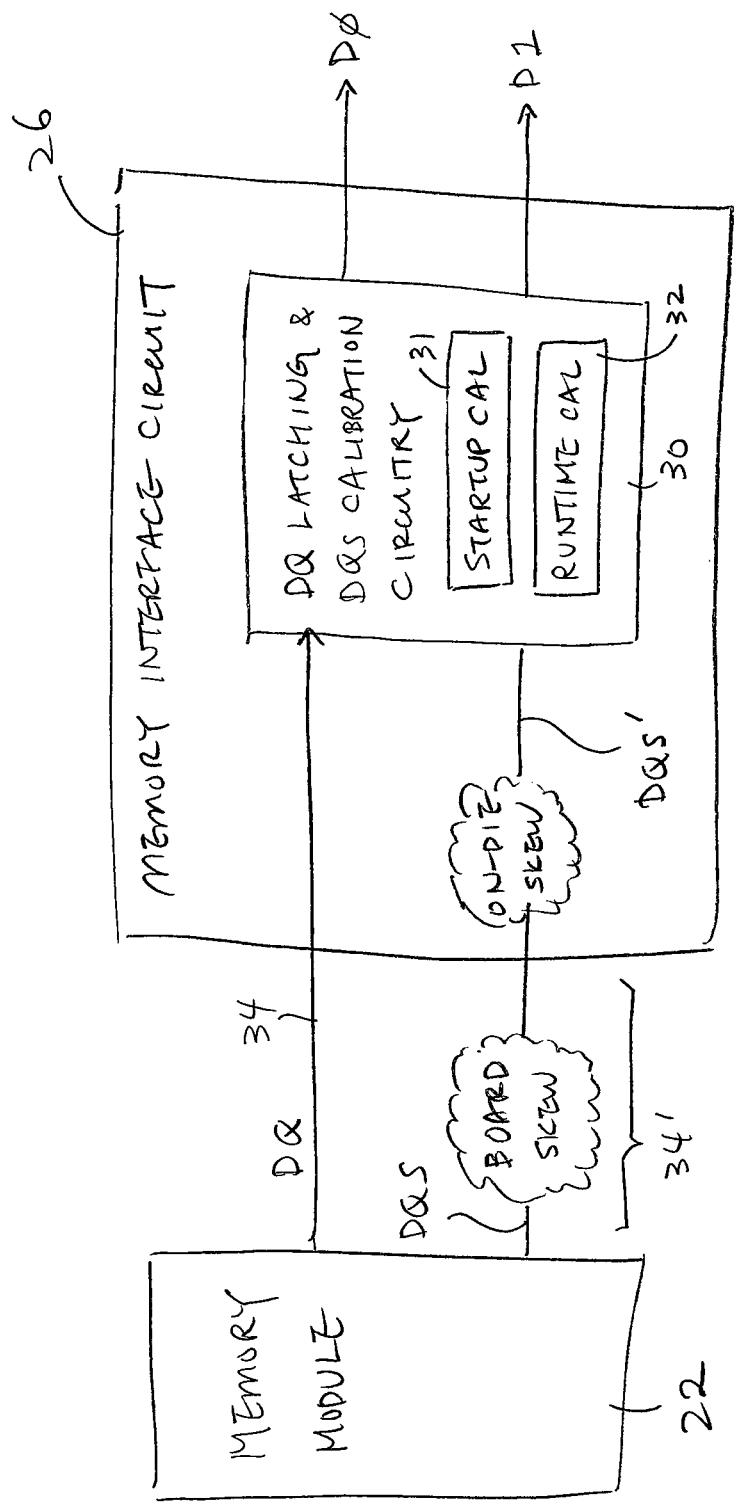
FIG. 4 is a diagram of an illustrative memory interface circuit that includes runtime data strobe calibration circuitry in accordance with an embodiment of the present invention.

FIG. 4 is a diagram illustrating read signal flow associated with one memory group. For clarity, data flow and circuitry associated with the other memory groups are omitted. As described above in connection with FIG. 3, circuitry 30 may include clocked storage elements such as edge-triggered flip-flops or level-sensitive latches for capturing incoming read data. These clocked storage elements may be controlled using the associated DQS signals.

In an ideal scenario, the data and data strobe signals arriving at memory interface circuit 26 have rising clock edges that are perfectly aligned. In one suitable arrangement, memory interface circuit 26 may include a delay circuit (not shown) configured to delay the data strobe signal by a quarter clock cycle so that the rising edges of the data strobe signal clocks at the center of each data window (i.e., so that setup and hold times are equal).

In practice, however, data signal DQ conveyed over path 34 and data strobe signal DQS conveyed over path 34' from memory module 22 to memory interface circuit 26 may suffer from DQ/DQS skew (i.e., DQ and DQS arriving at memory interface circuit 26 may have rising clock edges that are potentially offset with respect to each another). For example, differences in the lengths of board traces, on-die metal routing lines, and packaging material characteristics associated with paths 34 and 34' may result in board skew and on-die skew. Board skew and on-die skew may cause the data strobe signal to be undesirably skewed with respect to the data signal. In the example of FIG. 4, signal DQS' arriving at circuitry 30 may be skewed with respect to the associated DQ signals. As a result, the rising/falling edge of delayed data strobe signal may not be positioned at the center of a corresponding data window, thereby reducing setup and hold times.

To compensate for such types of skew, circuitry 30 may be provided with calibration circuitry such as startup DQ/DQS calibration circuit 31 and runtime DQ/DQS calibration circuitry 32. As the name implies, calibration circuit 31 may be used during device startup to minimize any skew between the DQ/DQS signals (e.g., circuit 31 may be used upon powering up device 10 to maximize setup and hold times), whereas calibration circuitry 32 may be used during runtime to continuously perform DQ/DQS calibration on a periodic or non-periodic basis (e.g., circuitry 32 may be used during normal user operation to monitor the setup and hold times and to perform recalibration to compensate for random system variations).

Figure 5:
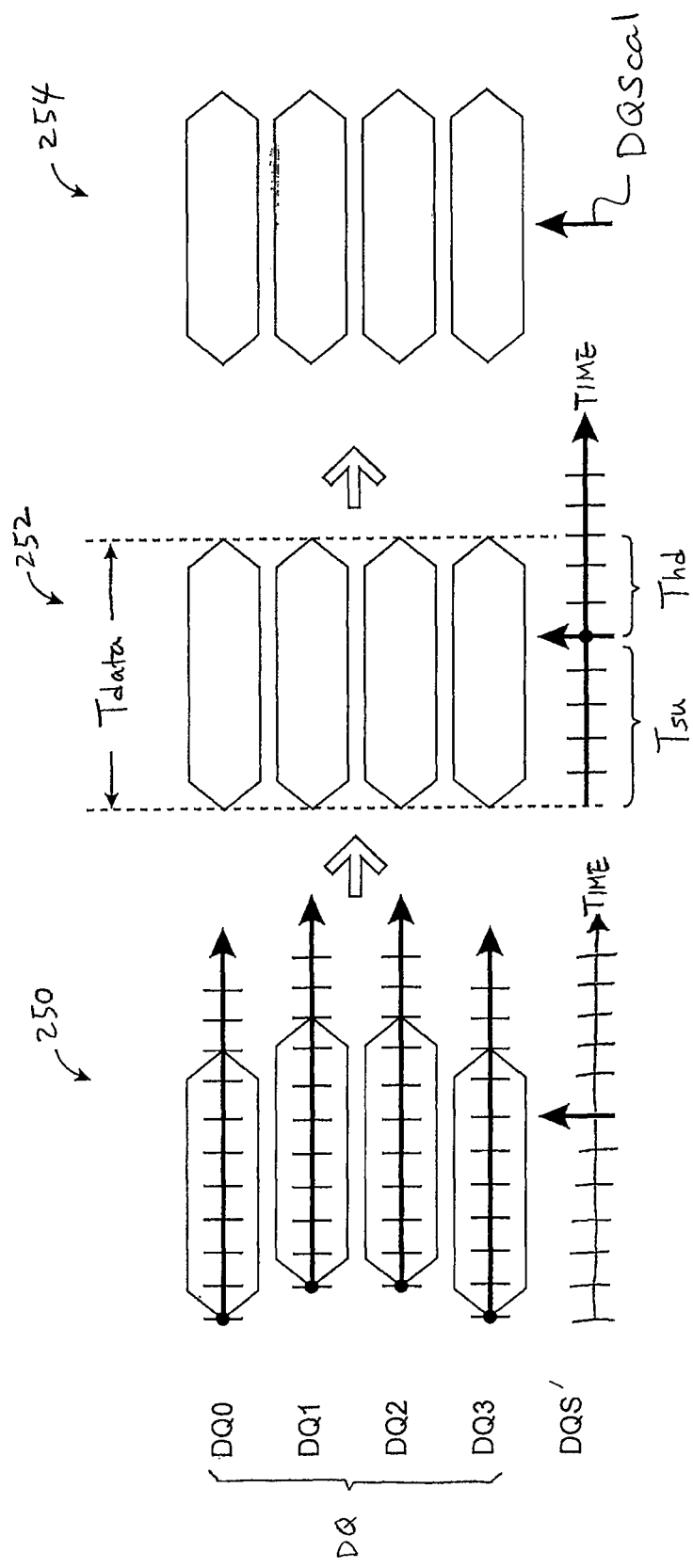
FIG. 5 is a diagram showing illustrative steps involved in performing data de-skew calibration in accordance with an embodiment of the present invention.

FIG. 5 is a diagram of illustrative steps involved in performing DQ/DQS calibration (sometimes referred to as data de-skew or read DQ/DQS centering). Read DQ/DQS centering may serve to place the rising and falling edges of the data strobe signal at the center of each valid DQ window (i.e., to maximize DQ and DQS setup and hold margins).

Diagram 250 shows a first snapshot in time before DQ/DQS centering has been performed. As shown in diagram 250, the DQ signals associated with different memory groups may be offset in time with respect to one another (e.g., DQ0 from the first memory group and DQ1 from the second memory group are offset by one delay step). In this example DQ0 and DQ3 arrive one delay step earlier than DQ1 and DQ2. Signal DQS' is also not placed at the center of each DQ window (i.e., signal DQS' is skewed with respect to the different DQ bits).

Diagram 252 shows a second snapshot in time after the data signals have been equalized. For example, DQ0 and DQ3 may be delayed by one delay step so that DQ0-DQ4 are aligned to a common read data valid window Tdata. During a first time period, the data signals may be collectively delayed to determine the DQ range (e.g., to measure a setup time Tsu). During a second time period, DQS' may be delayed to determine the DQS range (e.g., to measure a hold time Thd). In the example of FIG. 5, the measured Tsu is equal to five delay steps, whereas the measure Thd is equal to three delay steps. Signal DQS' may be shifted back to its original position (i.e., its position in diagram 250) after determining Thd.

Diagram 254 shows a third snapshot in time after DQ/DQS centering has been performed. In this example, each of signals DQ0-DQ3 have been delayed by one additional delay step so that Tsu and Thd are equal (e.g., so that the DQS signal is centered within Tdata). The data strobe signal that is centered within data valid window Tdata is sometimes referred to as a calibrated data strobe signal DQScal.

During normal operation of device 10, the performance of memory interface circuit 26 may be affected by variations in operating conditions such as variations in voltage, temperature, etc. Variations in voltage and temperature (sometimes referred to as "VT" variations) may cause data and data strobe signals to deviate from their optimum calibrated positions as operating conditions change (e.g., as temperature rises and falls, as power supply voltage increases and decreases, etc.).

Figure 6:
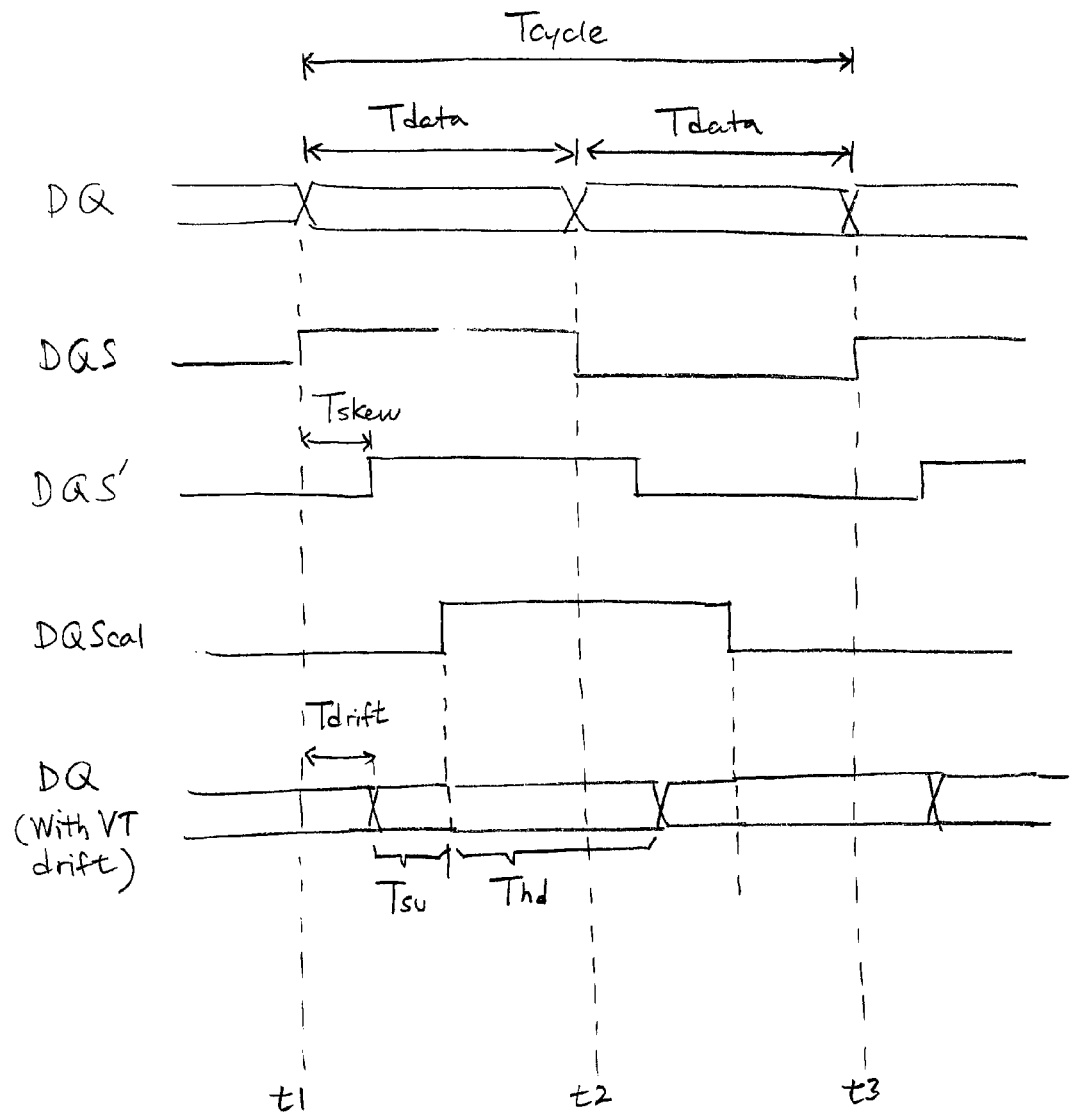
FIG. 6 is a timing diagram showing how variation can affect memory operation in accordance with an embodiment of the present invention.

FIG. 6 is a timing diagram showing how VT variations may affect calibrated data and data strobe signals. As shown in FIG. 6, signals DQ and DQS may synchronously arrive at memory interface circuit 26 via paths 34 and 34', respectively. For example, DQ may toggle values at times t1, t2, and t3, whereas DQ3 may clock high, low, and high at times t1, t2, and t3, respectively. The data valid window Tdata may be equal to a half clock cycle Tcycle.

Board skew, on-die skew, process variation, and other sources of skew may cause arriving data strobe signal DQS' to be delayed by Tskew relative to the arriving data signal DQ (as an example). Calibration procedures of the type described in connection with FIG. 5 may be used to calibrate memory interface circuit 26 so that the data strobe signal is properly positioned within each data window Tdata (e.g., so that DQS-cal is centered within Tdata).

In the presence of variations in operating conditions, signal DQ that has previously been calibrated may suffer from undesired drift (e.g., DQ may be shifted from its calibrated position by Tdrift), thereby degrading timing margins. In this example, setup time Tsu is degraded. In other scenarios, hold time Thd may be degraded. The embodiments described herein can be used to calibrate the data strobe signal in the presence of such variations to generate a calibrated data signal that is properly positioned within the new data window presented by the DQ signal as a result of such variations. In one embodiment the calibrated data strobe signal can be positioned such that it is centered within the data window (Tdata). In alternative embodiments, the calibrated data strobe signal can be positioned anywhere within the data window that would satisfy predetermined set and hold time requirements for the DQ signal. For example, if different margins are to be provided for the setup time and the hold time, respectively, then the calibrated data signal can be positioned to satisfy such requirements. As an alternative example, if the DQ signal has a predetermined likelihood to drift in a particular direction, the calibrated data strobe signal can be positioned off-center in the data window (i.e., the data strobe signal can be positioned to the right or left of the center for a DQ signal that is more likely to drift toward the right or left, respectively).

Runtime calibration circuitry 32 (sometimes referred to as runtime variation compensation circuitry) may be used during normal operation to compensate for such types of variations. For example, if DQ drift causes the setup time to be degraded, runtime calibration circuitry 32 may detect this degradation and in response to detecting that the setup time is reduced (i.e., lower than a predetermined target setup time), recalibrate the data strobe signal to such that the target setup time and hold time are satisfied. Such recalibration can result in providing the data strobe signal with positive delay to increase the setup time so that setup and hold times are matched. As another example, if DQ drift causes the hold time to be degraded, runtime calibration circuitry 32 may detect his degradation in performance and in response to detecting that hold time is reduced, provide the data strobe signal with negative delay to increase the hold time until setup and hold times are equal.

Figure 7:
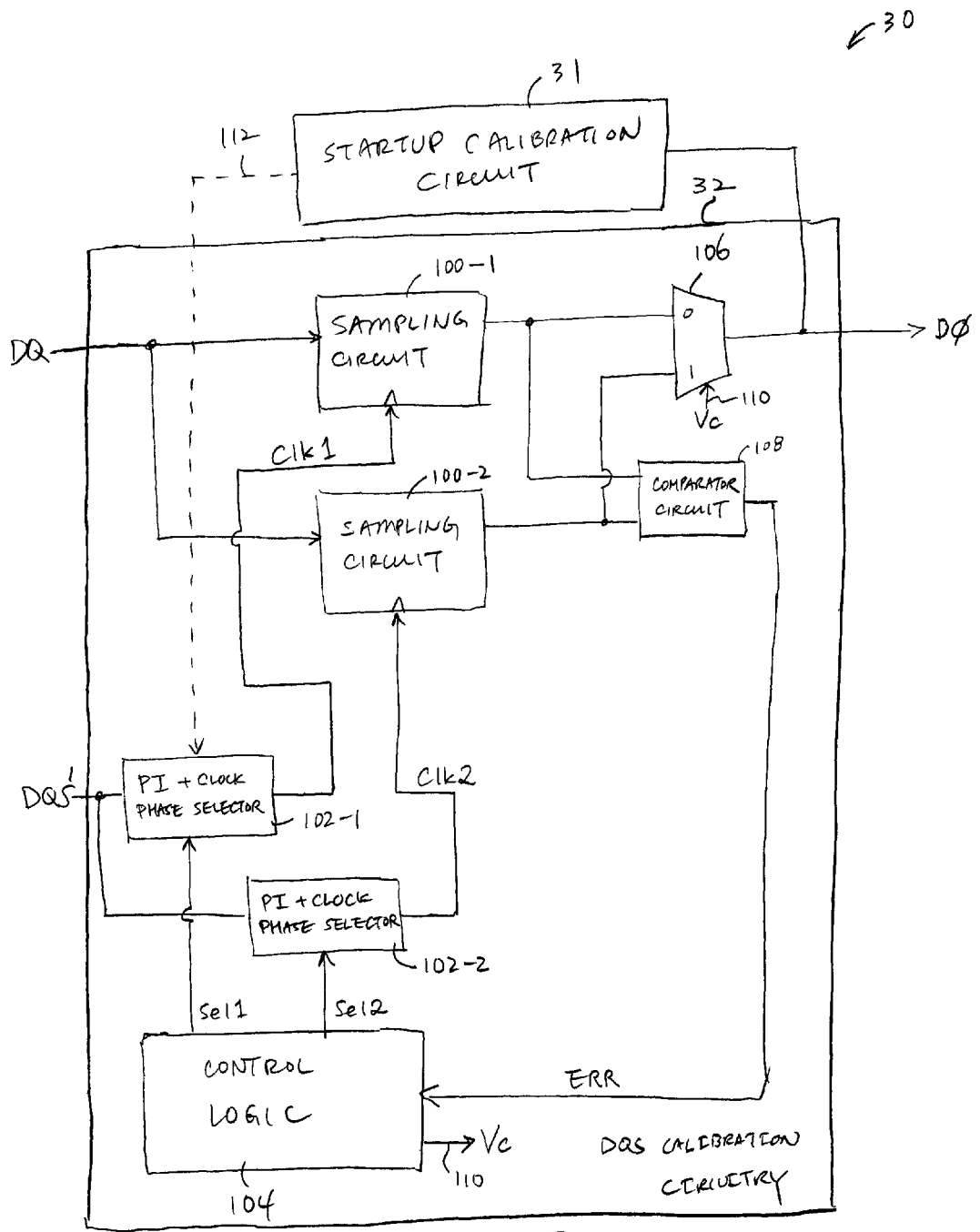
FIG. 7 is a diagram of illustrative data latching and data strobe calibration circuitry in accordance with an embodiment of the present invention.

FIG. 7 shows one suitable circuit implementation of circuitry 30, in accordance with one embodiment. As shown in FIG. 7, data latching and data strobe calibration circuitry 30 may include startup DQS calibration circuit 31 and runtime DQS calibration circuitry 32. Runtime calibration circuitry 32 may include clocked storage elements such as first data sampling circuit 100-1 and second data sampling circuit 100-2, clock generator circuits such as first phase interpolating and phase selection circuit 102-1 and second phase interpolating and phase selection circuit 102-2, control circuitry such as control logic 104, a multiplexing circuit such as multiplexer 106, and a comparison circuit such as comparator circuit 108. Data sampling circuits 100-1 and 100-2 serve as data latching circuits. In one embodiment, components of the calibration circuit 32 can be partitioned such that the data sampling circuits 100-1 and 100-2 can be part of a functional block and the other components of the calibration circuit are in a different functional block of the integrated circuit. In an alternative embodiment, the calibration circuit can be partitioned such that the data sampling circuits (100-1 and 100-2), the comparator circuit 108, and the multiplexer 106 are in one functional block and the ether components of the calibration circuit (e.g., 102-1, 102-2, and control logic 104) are in a different functional block of the integrated circuit. Such embodiments can be advantageously used in integrated circuits that share the control logic 104 to perform the calibration of more than one functional block coupled to the control logic 104. The control logic block can be implemented using either circuit components or it can be implemented using a programmable processor that is programmed to execute instructions in accordance with the embodiments described herein.

Circuitry 30 may have a first input configured to receive data signals DQ via path 34, a second input configured to receive data strobe signal DQS' via path 34', and at least one output on which captured data bits D0 is provided. Data bits D0 may represent data latched on the rising clock edges of DQS'. In integrated circuits with double data rate transfer capabilities, circuitry 30 may also include data latching circuits for capturing data bits on the falling clock edges of DQS' and calibration circuits associated with the falling clock edge data latching circuits (not shown).

Sampling circuit 100-1 may have a data input that receives DQ, a clock control input, and a data output. Sampling circuit 100-2 may have a data input that receives DQ, a clock control input, and a data output. Sampling circuits 100-1 and 100-2 may be positive-edge-triggered flip-flops (as an example). Multiplexer 106 may have a first (0) input that is coupled to the output of sampling circuit 100-1, a second (1) input that is coupled to the output of sampling circuit 100-2, a control input that receives a control signal Vc from control logic 104 via path 110, and an output that serves as the output for circuitry 30.

Multiplexer 106 may be configured to route signals from a selected one of its inputs to its output. For example, multiplexer 106 may be configured to route data signals from its first input to its output when control signal Vc is low and may be configured to route data signals from its second input to its output when control signal Vc is high. In other words, multiplexer 106 may be used to select which one of the sampling circuits 100 (i.e., circuits 100-1 and 100-2) is currently "active."

In a first scenario in which sampling circuit 100-1 is in active mode, multiplexer 106 may be configured to pass the data signals from circuit 100-1 to its output (e.g., Vc may be driven low) while sampling circuit 100-2 is placed in a "redundant" mode. In a second scenario in which sampling circuit 100-2 is in the active mode, multiplexer 106 may instead be configured to pass the data signals from circuit 100-2 to its output (e.g., Vc may be driven high) while sampling circuit 100-1 is placed in the redundant mode. The sampling circuit that is currently placed in the active mode may be referred to as the active data sampling circuit, whereas the sampling circuit that is currently placed in the redundant mode may be referred to as the redundant data sampling circuit.

Either one of circuits 100-1 and 100-2 can be placed in the active latching mode while the other circuit is placed in the redundant mode. The data sampling circuit that is currently placed in the active mode may serve to latch incoming data and to present the latched data other internal circuitry within device 10, whereas the data sampling circuit that is currently placed in the redundant mode may be used in performing runtime DQ/DQS calibration. Circuits 100-1 and 100-2 may alternate between the active mode and redundant mode. The active data latching mode may sometimes be referred to as "mission" mode. The redundant data latching mode may sometimes be referred to as "monitor" mode.

Comparator 108 may have a first input that is coupled to the output of data sampling circuit 100-1, a second input that is coupled to the output of data sampling circuit 100-2, and an output on which an error signal ERR is generated. Comparator 108 may serve to compare the data bits that are currently being latched by data sampling circuits 100-1 and 100-2. As an example, comparator 108 may include a logic XOR gate and timing alignment logic for aligning the data bits from circuits 100-1 and 100-2 prior to performing comparison with the logic XOR gate. When the data bits that are currently being latched by circuits 100-1 and 100-2 are equal, comparator 108 may output a deasserted ERR. When the data bits that are currently being latched by circuits 100-1 and 100-2 are mismatched, comparator 108 may assert ERR. Comparator circuit 108 may therefore serve as a comparison circuit that asserts error signal ERR whenever the data bit that is currently being latched by the redundant sampling circuit is different than the data bit that is currently being latched by the active sampling circuit.

Control logic 104 may have an input that receives signal ERR from comparator 108, a first output on which control signal Sel1 is provided, a second output on which control signal Sel2 is provided, and a third output on which signal Vc is provided. As described above, signal Vc may be fed to multiplexer 106 over path 110. Signal Sel1 may be used for controlling circuit 102-1 while signal Sel2 may be used for controlling circuit 102-2. Control logic 104 may be implemented using configurable logic (sometimes referred to as "soft" logic) or non-configurable logic (sometimes referred to as a "hardened" circuit).

Circuit 102-1 may receive signal DQS' over path 34' and may generate a corresponding clock signal Clk1 that is fed to the control input of data sampling circuit 100-1. Circuit 102-2 may also receive signal DQS' and may generate a corresponding clock signal Clk2 that is fed to the control input of data sampling circuit 100-2. Clock signals Clk1 and Clk2 generated in this way are sometimes referred to as first and second versions of the DQS', respectively.

Circuits 102 (e.g., circuits 102-1 and 102-2) may each include a phase interpolating circuit and a phase selection circuit. The phase interpolator may receive signal DQS' and may be used to generate clock signals having the same frequency as DQS' but with different respective phase offsets/delays. The phase selector circuit may receive the different clock signals that are generated by the phase interpolator and may output a selected one of the different clock signals. Circuit 102-1 may output signal Clk1 having a phase selected based on the value of control signal Sel1, whereas circuit 102-2 may output signal Clk2 having a phase selected based on the value of control signal Sel2.

Referring still to FIG. 7, startup calibration circuit 31 may have an input that receives signal D0 from the output of multiplexer 106 and an output on which a control signal is fed to circuit 102-1 via path 112. During startup, circuit 31 may perform read DQ/DQS centering operations that are described in connection with FIG. 5. When startup calibration operations are complete, circuit 102-1 may be configured to output signal Clk1 for controlling sampling circuit 100-1, which is initially set as the active data sampling circuit. Circuit 100-2 may initially be set as the redundant data sampling circuit.

Figure 8:
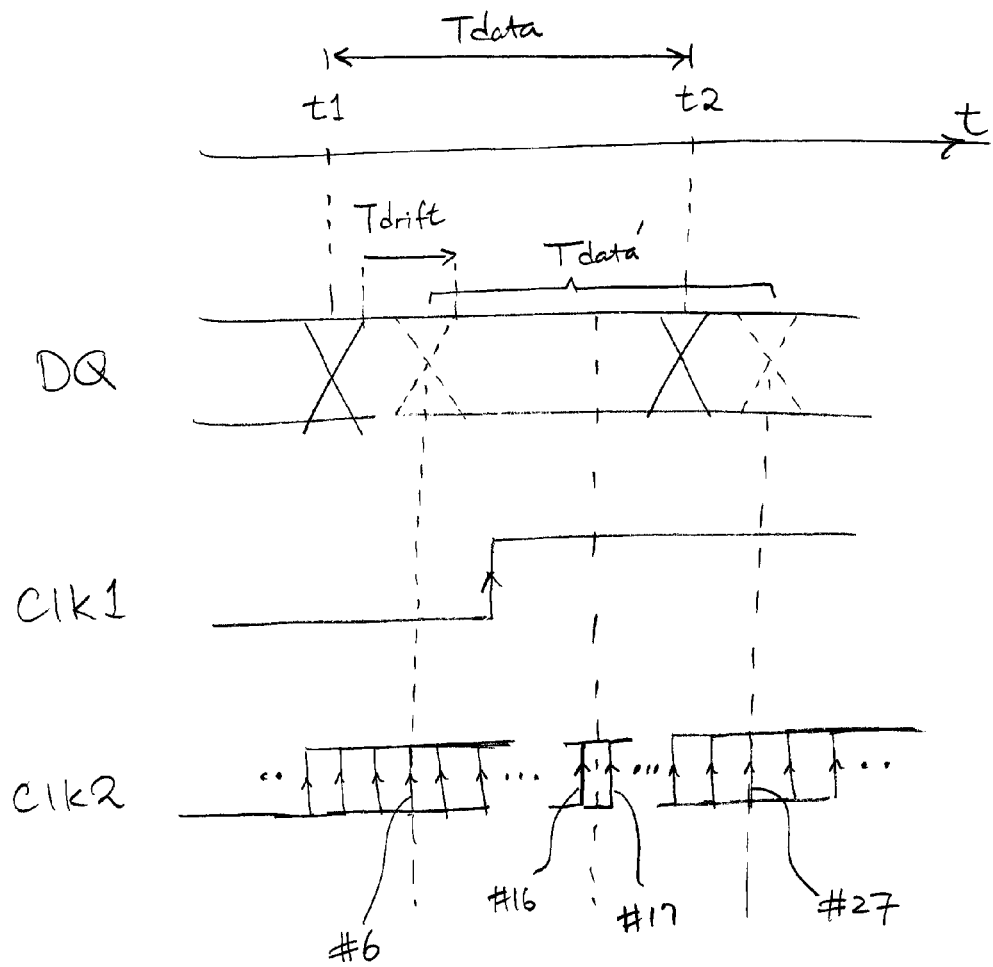
FIG. 8 is a timing diagram illustrating how a phase interpolator in the data latching and data strobe calibration circuitry of FIG. 7 can be used to generate clock signals with varying phases in accordance with an embodiment of the present invention.

FIG. 8 is a timing diagram showing how signal Clk1 may be centered within data valid window Tdata. During normal user operation, however, random sources of variations may shift DQ by amount Tdrift, causing the data valid window to shift to new position Tdata'. This type of data drift may result in reduced setup time and can affect the performance of memory access operations. In the example of FIG. 8, circuit 100-1 is currently serving as the active sampling circuit while circuit 100-2 serves as the redundant sampling circuit.

As the redundant sampling circuit, circuit 102-2 may be configured to sweep through the different interpolated phases to identify the boundaries of data valid window Tdata (e.g., control signal Sel2 may be monotonically increased or decreased to configure the phase selector in circuit 102-2 to output signal Clk2 with varying phases). Signal Clk2 may be increased or decreased using any suitable phase step (i.e., the phase interpolator may have any suitable resolution). As an example, circuits 102 may each be capable of outputting clock signals with 36 different clock phases, each of which are 10° offset with respect to each other.

When Clk2 has rising edges that are positioned within the current window Tdata', the data bits that are being latched by both sampling circuits 100 should match, thereby causing signal ERR to be deasserted. When Clk2 has rising edges that are positioned outside the current window Tdata', the data bits that are being latched by sampling circuits 100 may be different, thereby causing signal ERR to be asserted.

Signal Clk2 may have a rising edge that is set initially within Tdata' (e.g., signal ERR may initially be deasserted since both circuits 100 are latching the same data bit). Signal Sel2 may, for example, be decreased to shift Clk2 "left" in time until signal ERR is asserted. The first setting that causes signal ERR to be asserted when decreasing Sel2 corresponds to the left edge of Tdata'. Signal Sel2 may also be increased to shift Clk2 "right" in time until signal ERR is asserted. The first setting that causes signal ERR to be asserted when increasing Sel2 corresponds to the right edge of Tdata'. In the example of FIG. 8, setting #6 of Sel2 corresponds to the left edge of window Tdata' while setting #27 of Sel2 corresponds to the right edge of window Tdata'. Control logic 104 may then compute an updated phase setting corresponding to the optimal phase setting based on the measured Tdata' window edges. In this example, a phase setting of #16 or #17 may be used to place Clk2 at the center of Tdata'. The data valid window is sometimes referred to as the "data eye." The redundant data sampling circuit can therefore be used to obtain data eye boundary information by monitoring when signal ERR is asserted and deasserted.

This scenario in which signal Clk2 has a rising edge that is initially positioned within the current data eye is merely illustrative. In other suitable arrangements, signal Clk2 may have a rising edge that is initially placed outside of Tdata (e.g., to the left of the left eye boundary or to the right of the right eye boundary).

Based on the measured eye boundary information, control logic 104 may determine whether the current placement of Clk1 within measured data eye (Tdata') is satisfactory. If the clock edge of Clk1 is too close to either the left boundary of Tdata' or the right boundary of data eye/window Tdata' (i.e., if the current measured setup time or hold time is less than a predetermined threshold), control logic 104 may reset Clk2 to be centered within Tdata' and use sampling circuit 100-2 as the active sampling circuit while using sampling circuit 100-1 as the redundant sampling circuit. During this swap, control signal Vc may also be driven high so that multiplexer 106 can route the data bits from sampling circuit 100-2 to its output. When sampling circuit 100-1 is used as the redundant circuit, signal Sel1 may be swept to identify the boundaries of the current data eye associated with newly arriving DQ signals.

In general, a selected one of data sampling circuits 100 may be placed in active/mission mode while the other data sampling circuit 100 is placed in redundant mode. The active sampling circuit 100 will be used to latch incoming user data bits, which are then routed to the output of multiplexer 106. The redundant sampling circuit 100 will be used to obtain data eye boundary information by sweeping through the different clock phases as illustrated in FIG. 8. The roles of the two sampling circuits may be swapped periodically or whenever setup and held time margins are sufficiently degraded. Prior to swapping, the clock that controls the redundant sampling circuit may be updated to exhibit the most recently computed optimum clock phase setting. In other words, when swapping is complete, the currently active sampling circuit should receive a clock signal that is relatively close to the center of the actual data eye.

Circuit 32 may be continuously operated in this way during normal operation to perform runtime DQ/DQS calibration to ensure that the data latching clock signal tracks the DQ drift. Circuitry that is being used to obtain Tdata boundary information may therefore sometimes be referred to as data eye boundary monitoring circuitry.

Figure 9:
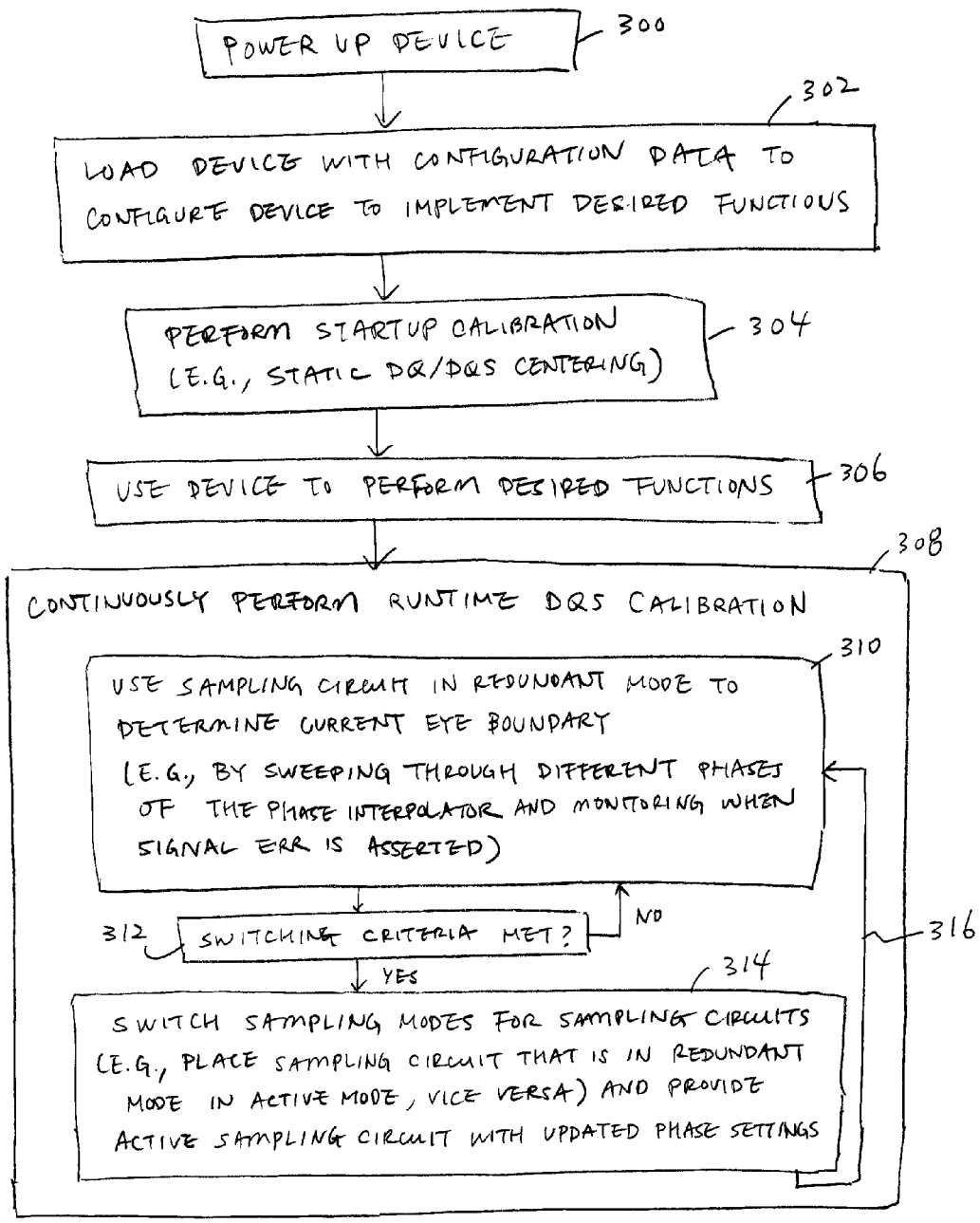
FIG. 9 is a flow chart of illustrative steps for performing runtime data strobe calibration using the data strobe calibration circuitry of the type shown in connection with FIG. 7 in accordance with an embodiment of the present invention.

FIG. 9 is a flow chart of illustrative steps for operating circuitry 30 of the type described in connection with FIG. 7. At step 300, device 10 may be powered up. At step 302, device 10 may be loaded with configuration data to implement custom logic functions (if device 10 is a programmable integrated circuit). Step 302 need not be performed for other types of integrated circuits such as application specific integrated circuits, application specific standard products, etc.

At step 304, DQ de-skew calibration may be performed using startup calibration circuit 31 (e.g., read DQ/DQS centering may be performed by adjusting DQ de-skew delay circuit using steps described in connection with FIG. 5). At step 306, device 10 may be placed in normal operation to perform desired functions.

During normal operation, circuitry 32 may be used to continuously perform DQS calibration (step 308). As described in connection with FIG. 7, circuitry 32 may include two data sampling circuits, one of which may be currently serving as the active data sampling circuit while the other one may be currently serving as the redundant data sampling circuit.

At step 310, the redundant data sampling circuit may be used to determine the current data eye boundaries (e.g., the data sampling circuit currently operating in redundant mode may be used to locate the left and right edges of the data valid window). Determination of the eye boundaries may involve sweeping through the different phases of the phase interpolator and monitoring when signal ERR is asserted/deasserted.

At step 312, control logic 104 may determine whether switching criteria have been met. As an example, if the clock signal associated with the active sampling circuit deviates from the current computed center location of the data valid window by a large enough margin, the switching criteria may be satisfied. As another example, a timer may be used to perform mode swapping for the sampling circuits on a periodic basis, so the switching criteria will be met whenever the timer reaches certain threshold values. If the switching criteria are not met, step 310 may be repeated. If the switching criteria are met, processing may continue to step 314. If desired, a computer interface can be used to remotely diagnose or monitor the data eye boundary of each I/O pin based on the information obtained from circuitry 30.

At step 314, the modes of the data sampling circuits may be swapped (e.g., the formerly redundant data sampling circuit may be placed in active mode while the formerly active data sampling circuit may be placed in redundant mode). The data sampling circuit that has just been placed in the active mode should be provided with updated phase settings (i.e., the active sampling circuit immediately after the swap should be controlled by a clock signal having edges that are close to the center of the data valid window). Processing may then loop back to step 310 to continue data eye boundary monitoring operations, as indicated by path 316. Performing runtime DQ/DQS calibration using redundant data latching circuitry allows for DQS recalibration without having to interrupt memory system operation since the active data sampling circuit can continue to latch user data bits.

The circuit arrangement of FIG. 7 and the steps of FIG. 9 are merely illustrative and do not serve to limit the scope of the present invention. If desired, circuitry 30 may provided with other suitable circuitry for continuously performing data eye monitoring during runtime without interrupting normal system operation.

Figure 10:
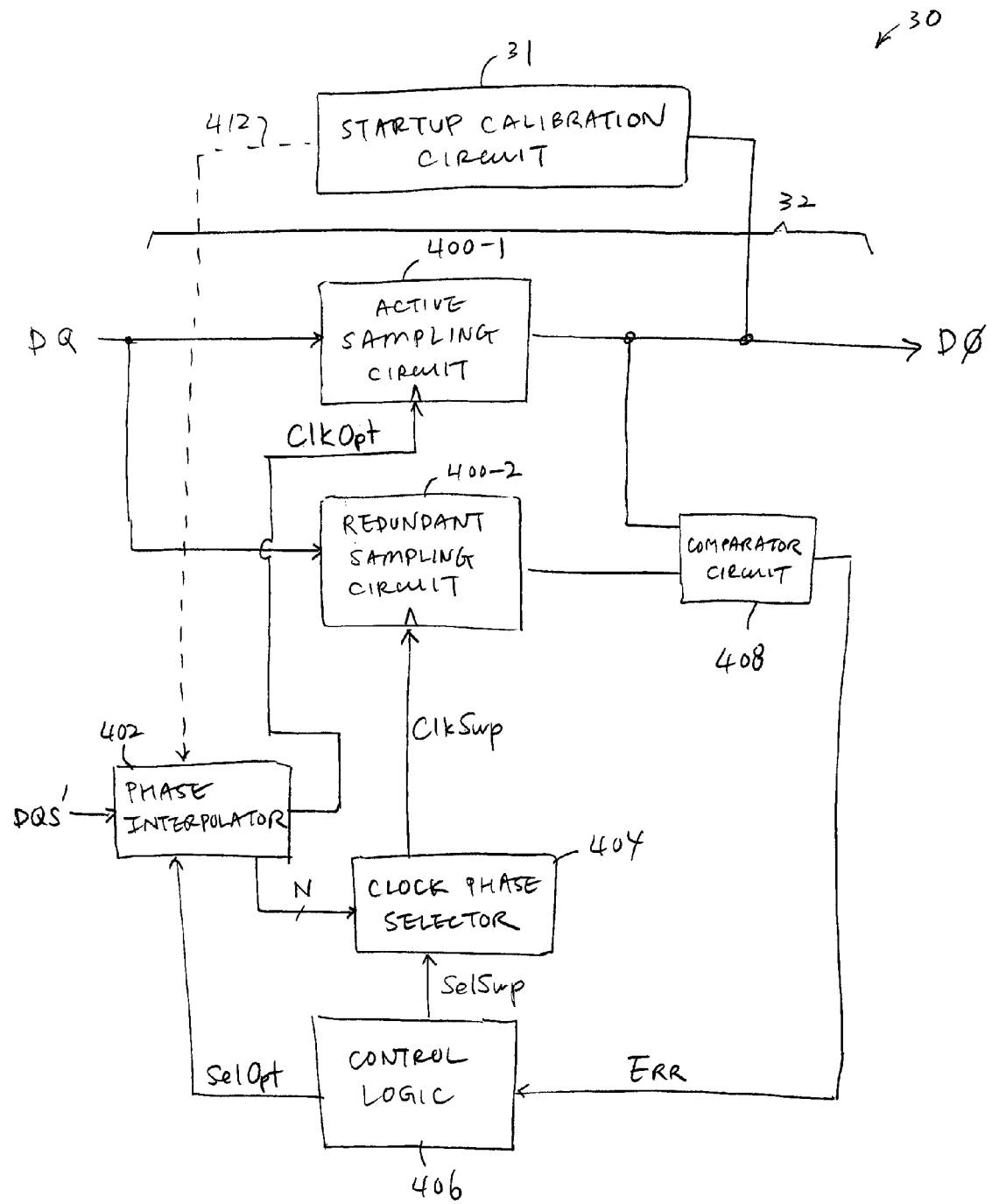
FIG. 10 is a diagram of illustrative data latching and data strobe calibration circuitry in accordance with an embodiment of the present invention.

FIG. 10 shows another suitable arrangement of data latching and calibration circuitry 30. As shown in FIG. 10, runtime calibration circuitry 32 may include clocked storage elements such as first data sampling circuit 400-1 and second data sampling circuit 400-2, a clock generator circuit such as phase interpolator 402, a phase selection circuit such as clock phase selector 404, control circuitry such as control logic 406, and a comparison circuit such as comparator circuit 408. Data sampling circuits 400-1 and 400-2 serve as data latching circuits and are sometimes considered to be separate from the calibration circuitry.

Sampling circuit 400-1 may have a data input that receives DQ, a clock control input, and a data output. Sampling circuit 400-2 may have a data input that receives DQ, a clock control input, and a data output. Sampling circuits 400-1 and 400-2 may be positive-edge-triggered flip-flops (as an example). The data output of sampling circuit 400-1 may serve as the output of circuitry 30 on which data signals D0 are provided to other circuitry within device 10. Circuit 400-1 configured in this arrangement may serve as a dedicated active sampling circuit for memory interface circuitry 26. Circuit 400-2, on the other hand, may serve as a dedicated redundant sampling circuit that is only used for eye monitoring purposes. This implementation does not involve swapping modes and as a result, circuitry 30 of FIG. 10 need not include a multiplexer.

Comparator 408 may have a first input that is coupled to the output of active sampling circuit 400-1, a second input that is coupled to the output of redundant sampling circuit 400-2, and an output on which an error signal ERR is generated. Comparator 408 may serve to compare the data bits that are currently being latched by data sampling circuits 400-1 and 400-2. As an example, comparator 408 may include a logic exclusive-OR (XOR) gate and timing alignment logic for aligning the data bits from circuits 400-1 and 400-2 prior to performing comparison with the logic XOR gate. When the data bits that are currently being latched by circuits 400-1 and 400-2 are equal, comparator 408 may output a deasserted ERR. When the data bits that are currently being latched by circuits 400-1 and 400-2 are different, comparator 408 may assert signal ERR. Comparator circuit 408 may therefore serve as a comparison circuit that asserts error signal ERR whenever the data bit that is currently being latched by the redundant sampling circuit 400-2 is different than the data bit that is currently being latched by the active sampling circuit 400-1.

Control logic 406 may have an input that receives signal ERR from comparator 408, a first output on which control signal SelOpt is provided, and a second output on which control signal SelSwp is provided. Signal SelOpt may be used for controlling phase interpolator 402, whereas signal SelSwp may be used for controlling clock phase selector 404. Control logic 406 may be implemented using configurable logic (sometimes referred to as "soft" logic) or non-configurable logic (sometimes referred to as a "hardened" circuit).

Phase interpolator 402 may receive signal DQS' over path 34' and may generate a corresponding clock signal ClkOpt that is fed to the control input of active sampling circuit 400-1.

Signal ClkOpt may be a phase delayed version of signal DQS'. The amount of phase delay for ClkOpt relative to DQS' may be set based on the value of control signal SelOpt. Phase interpolator 402 may also be used to generate N clock signals having the same frequency as DQS' but with different respective phase offsets/delays. As an example, phase interpolator 402 may each be capable of outputting 18 clock signals with different respective clock phases, each of which are 20° offset with respect to each other. Clock phase selector 404 may receive the N different clock signals that are generated by phase interpolator 402 in parallel and may output a selected one of the different clock signals as signal ClkSwp to the clock control input of redundant sampling circuit 400-2. The selection of ClkSwp that is output by clock phase selector 404 may be set based on the value of control signal SelSwp. Clock signals ClkOpt and ClkSwp generated in this way are sometimes referred to as first and second versions of the DQS', respectively.

Referring still to FIG. 10, startup calibration circuit 31 may have an input that receives signal D0 from the output of active sampling circuit 400-1 and an output on which a control signal is fed to phase interpolator 402 via path 412. During device startup, circuit 31 may perform read DQ/DQS centering operations that are described in connection with FIG. 5. When startup calibration operations are complete, phase interpolator 402 may output signal ClkOpt that is close to the center of the data valid window immediately after startup (e.g., calibration circuit 31 may configure control logic 406 to output a calibrated SelOpt that maximizes setup/hold times immediately after startup).

Following startup calibration, signal ClkOpt may initially be centered within the data valid window. During normal user operation, however, various sources of variations (as discussed above) may cause the data valid window (i.e., the data eye) to drift. This type of data drift may result in reduced setup time and can affect the accuracy of memory access operations.

During normal user operation, control logic 106 may be configured to monotonically increase or decrease signal SelSwp so that clock phase selector 404 outputs ClkSwp with varying phases. Sweeping through the available phases in this way can help identify the boundaries of the data valid window. The resolution of the phase sweep may depend on the number N of clock signals that are being generated by phase interpolator 402.

When ClkSwp has rising edges that are positioned within the current data eye, the data bits that are being latched by both sampling circuits 400 (i.e., active data latching circuit 400-1 and redundant data latching circuit 400-2) should match, thereby causing signal ERR to be deasserted. When ClkSwp has rising edges that are positioned outside the current data eye, the data bits that are being latched by sampling circuits 400 may be different, thereby causing signal ERR to be asserted.

Signal ClkSwp may have a rising edge that is set initially within the current data eye (e.g., signal ERR may initially be deasserted since both circuits 400 are latching the same data bit. Signal SelSwp may, for example, be decreased to shift ClkSwp "left" in time until signal ERR is asserted. The first setting that causes signal ERR to be asserted when decreasing SelSwp corresponds to the left boundary of the data eye. Signal SelSwp may also be increased to shift ClkSwp "right" in time until signal ERR is asserted. The first setting that causes signal ERR to be asserted when increasing SelSwp corresponds to the right boundary of the data eye. Control logic 406 may then compute an updated phase setting that can be used to place DQS' at the center of the current data eye.

This scenario in which signal ClkSwp has a rising edge that is initially positioned within the current data eye is merely illustrative. In other suitable arrangements, signal ClkSwp may have a rising edge that is initially placed outside of the data eye (e.g., to the left of the left eye boundary or to the right of the right eye boundary).

Based on the gathered data eye boundary information, control logic 406 may determine whether the current placement of ClkOpt within the current data eye is satisfactory. If the clock edge of ClkOpt is too close to either the left edge of measured the data eye or the right edge of the measured data eye (i.e., if the current measured setup time or hold time is less than a predetermined threshold), control logic 406 may reset ClkOpt to be centered within the measured data eye.

In the arrangement of FIG. 10, circuit 400-1 will always be used in active/mission mode to latch incoming user data bits while circuit 400-2 will always be used in redundant mode to perform data eye monitoring. Control logic 406 may update ClkOpt periodically or whenever setup and hold time margins are sufficiently degraded to place ClkOpt at the center of the currently measured data eye. Circuit 32 of FIG. 10 may be continuously operated in this way during normal operation to perform runtime DQ/DQS calibration to ensure that data latching clock signal ClkOpt tracks the DQ drift.

Figure 11:
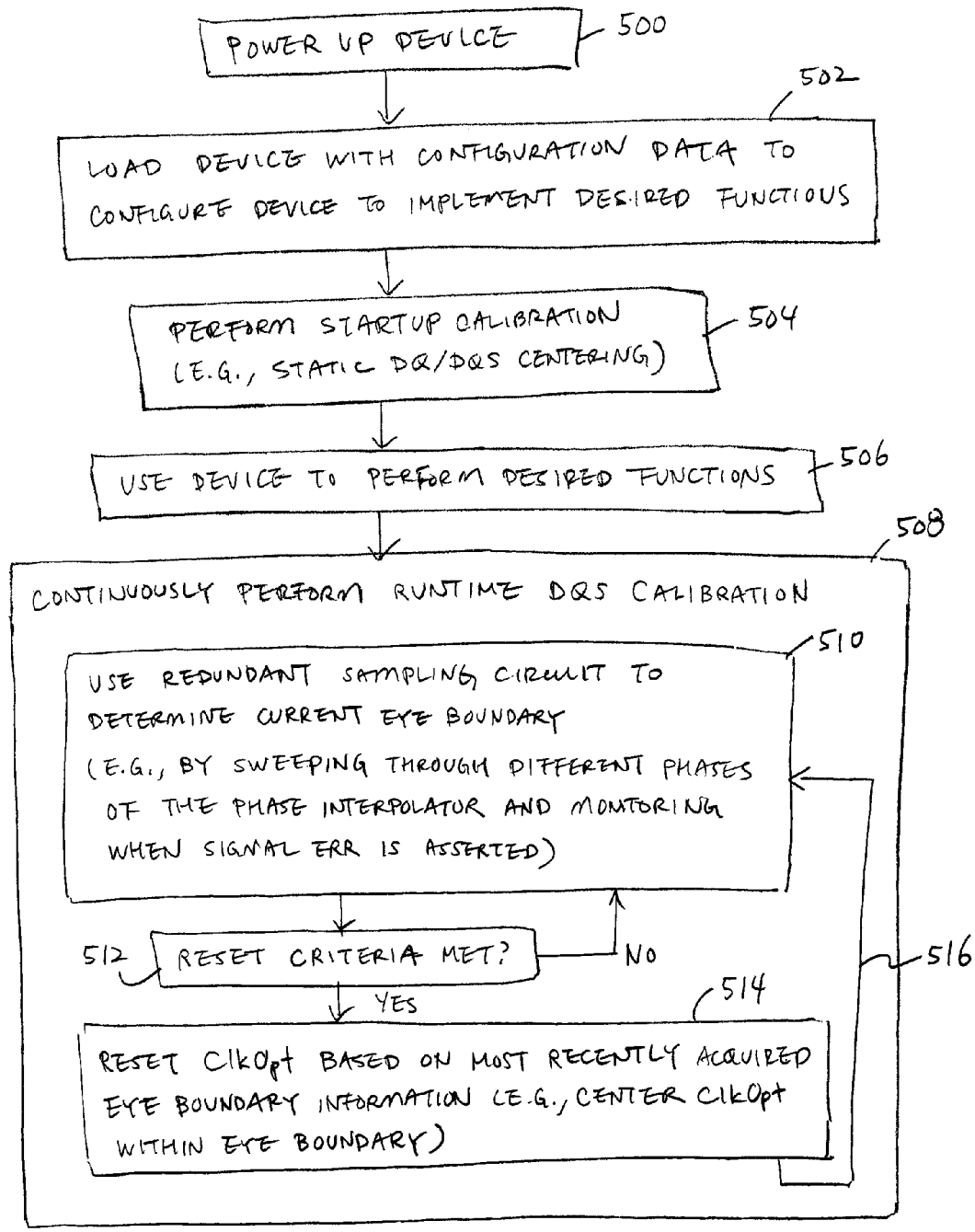
FIG. 11 is a flow chart of illustrative steps for performing runtime data strobe calibration using the data strobe calibration circuitry of the type shown in connection with FIG. 10 in accordance with an embodiment of the present invention.

FIG. 11 is a flow chart of illustrative steps for operating circuitry 30 of the type described in connection with FIG. 10. At step 500, device 10 may be powered up. At step 502, device 10 may be loaded with configuration data to implement custom logic functions (if device 10 is a programmable integrated circuit).

At step 504, DQ de-skew calibration may be performed using startup calibration circuit 31 (e.g., read DQ/DQS centering may be performed by adjusting DQ de-skew delay circuit using steps described in connection with FIG. 5). At step 506, device 10 may be placed in normal operation to perform desired functions.

During normal operation, circuitry 32 may be used to continuously perform DQS calibration (step 508). As described in connection with FIG. 10, circuitry 32 may include an active data latching circuit 400-1 and a redundant data latching circuit 400-2.

At step 510, the redundant sampling circuit may be used to determine the current data eye boundaries. Determination of the eye boundaries may involve stepping through the different phases of the phase interpolator using the clock phase selector and monitoring when signal ERR is asserted.

At step 512, control logic 406 may determine whether the switching criteria have been met. As an example, if ClkOpt that is controlling the active data latching circuit deviates from the center location of the measured data valid window by a large enough margin, the switching criteria may be satisfied. As another example, a timer may be used to perform periodically perform updates for ClkOpt, so the switching criteria may be met whenever the timer reaches certain threshold values. If the switching criteria are not met, step 510 may be repeated. If the switching criteria are met, processing may continue to step 514. If desired, a computer interface can be used to remotely diagnose or monitor the data eye boundary of each I/O pin based on the information obtained from circuitry 30.

At step 514, signal ClkOpt may be updated or reset based on the most recently measured eye boundary information so that ClkOpt is positioned close to the center of the current data eye. Processing may then loop back to step 510 to continue data eye boundary monitoring operations, as indicated by path 516. Performing runtime DQ/DQS calibration using redundant data latching circuitry allows for DQS recalibration without having to interrupt memory system operation since the active data latching circuitry can continue to latch user data bits.

The circuit arrangement of FIG. 10 and the steps of FIG. 11 are merely illustrative and do not serve to limit the scope of the present invention. If desired, circuitry 30 may provided with other suitable circuitry for continuously performing data eye monitoring during runtime without interrupting normal system operation.

In certain embodiments, the calibration of the data strobe signal can be performed either continuously or intermittently after predetermined intervals of time. In alternative embodiments, the drift of the data signal DQ can be monitored and calibration can be performed when the drift is greater than a predetermined amount. In other embodiments, the calibration can be performed in response to a command received at the control logic (e.g. control logic 104 of FIG. 7). One or more of these features can incorporated in the embodiments described above.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit that receives a data signal and a data strobe signal from external memory, comprising:
   a first data sampling circuit that receives and latches the data signal using a first version of the data strobe signal;
   a second data sampling circuit that receives and latches the data signal using a second version of the data strobe signal, wherein the first and second data sampling circuits are configured to alternate between an active data sampling mode and a redundant data eye monitoring mode; and
   a comparator circuit that compares the data signal latched by the first data sampling circuit to the data signal latched by the second data sampling circuit to determine whether the first version of the data strobe signal satisfies performance criteria.

2. The integrated circuit defined in claim 1, wherein the comparator circuit comprises a logic exclusive-OR gate and data bit timing alignment logic.

3. The integrated circuit defined in claim 1, wherein the first and second data sampling circuits each have an output, further comprising:
   a multiplexing circuit having a first input that is coupled to the output of the first data sampling circuit and a second input that is coupled to the output of the second data sampling circuit.

4. The integrated circuit defined in claim 1, wherein the first and second data sampling circuits comprise edge-triggered flip-flops.

5. The integrated circuit defined in claim 1, further comprising:
   control circuitry that receives an error signal from the comparator circuit and that determines whether the first version of the data strobe signal satisfies the performance criteria by monitoring when the error signal is asserted and deasserted.

6. The integrated circuit defined in claim 5, further comprising:
   a first phase interpolating and clock phase selection circuit having a first input that receives the data strobe signal, a second input that receives a first control signal from the control circuitry, and an output on which the first version of the data strobe signal is fed to the first data sampling circuit; and
   a second phase interpolating and clock phase selection circuit having a first input that receives the data strobe signal, a second input that receives a second control signal from the control circuitry, and an output on which the second version of the data strobe signal is fed to the second data sampling circuit.

7. The integrated circuit defined in claim 1, further comprising:
   a startup calibration circuit that is coupled to a selected one of the first and second data sampling circuits and that is operable to perform data de-skew and data strobe centering operations upon powering on the integrated circuit.

8. A method of operating an integrated circuit that receives data signals and a data strobe signal from external memory, comprising:
   receiving the data signals and a given delayed version of the data strobe signal with a first data sampling circuit;
   while the first data sampling circuit is receiving the given delayed version of the data strobe signal and receiving the data signals and different respective versions of the data strobe signal with a second data sampling circuit; and
   with a multiplexing circuit, receiving the data signals that have been latched by the first data sampling circuit and receiving the data signals that have been latched by the second data sampling circuit.

9. The method defined in claim 8, further comprising:
   with a comparison circuit, comparing the data signals that have been latched by the first data sampling circuit with the data signals that have been latched by the second data sampling circuit and outputting an error signal based on the comparison.

10. The method defined in claim 9, further comprising:
    with control circuitry, receiving the error signal from the comparison circuit and generating corresponding first and second control signals.

11. The method defined in claim 10, further comprising:
    using the second data sampling circuit to obtain data eye boundary information associated with the data signals by monitoring when the error signal is asserted and deasserted.

12. The method defined in claim 11, further comprising:
    providing a selected delayed version of the data strobe signal to the second data sampling circuit based on the obtained data eye boundary information; and
    while the second data sampling circuit is receiving the selected delayed version of the data strobe signal, receiving the different respective versions of the data strobe signal with the first data sampling circuit.

13. The method defined in claim 11, further comprising:
    adjusting the given delayed version of the data strobe signal based on the obtained data eye boundary information.

14. The method defined in claim 8, further comprising:
    with a startup calibration circuit, performing data de-skew and data strobe centering operations upon powering on the integrated circuit.

15. A method of operating an integrated circuit that receives data signals and a data strobe signal from system memory, comprising:
    with a first data sampling circuit operated in active mode, latching the data signals using the data strobe signal; and
    using a second data sampling circuit operated in redundant mode to obtain data eye boundary information associated with the data signals.

16. The method defined in claim 15, further comprising:
    determining whether the data strobe signal is properly positioned with respect to the data signals based on the obtained data eye boundary information.

17. The method defined in claim 16, further comprising:
    in response to determining that the data strobe signal fails to be properly positioned with respect to the data signals, placing the first data sampling circuit in the redundant mode to obtain additional data eye boundary information and placing the second data sampling circuit in the active mode to latch the data signals using an updated version of the data strobe signal.

18. The method defined in claim 16, further comprising:
    in response to determining that the data strobe signal fails to be properly positioned with respect to the data signals, latching the data signals with the first data sampling circuit using an updated version of the data strobe signal, wherein the updated version of the data strobe signal is adjusted based on the obtained data eye boundary information.

* * * * *